(12) United States Patent
Lin et al.

(10) Patent No.: US 9,406,581 B2
(45) Date of Patent: Aug. 2, 2016

(54) METHODS OF PACKAGING SEMICONDUCTOR DEVICES AND STRUCTURES THEREOF

(71) Applicant: Taiwan Semiconductor Manufacturing Company, Ltd., Hsin-Chu (TW)

(72) Inventors: Jing-Cheng Lin, Hsin-Chu (TW);
Jui-Pin Hung, Hsin-Chu (TW);
Yi-Hang Lin, Hsin-Chu (TW);
Tsan-Hua Tung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/833,344

(22) Filed: Aug. 24, 2015

(65) Prior Publication Data
US 2015/0364395 A1    Dec. 17, 2015

Related U.S. Application Data

(62) Division of application No. 13/270,850, filed on Oct. 11, 2011, now Pat. No. 9,117,682.

(51) Int. Cl.
*H01L 23/48*    (2006.01)
*H01L 23/31*    (2006.01)
*H01L 23/538*   (2006.01)
(Continued)

(52) U.S. Cl.
CPC ...... *H01L 23/3135* (2013.01); *H01L 21/31051* (2013.01); *H01L 21/565* (2013.01); *H01L 23/293* (2013.01); *H01L 23/3114* (2013.01); *H01L 23/5386* (2013.01); *H01L 23/5389* (2013.01); *H01L 24/05* (2013.01); *H01L 24/11* (2013.01); *H01L 24/13* (2013.01); *H01L 24/19* (2013.01); *H01L 24/96* (2013.01); *H01L 25/0652* (2013.01); *H01L 25/50* (2013.01); *H01L 23/49816* (2013.01); *H01L 24/03* (2013.01); *H01L 2224/0231* (2013.01); *H01L 2224/0237* (2013.01); *H01L 2224/02379* (2013.01); *H01L 2224/03002* (2013.01); *H01L 2224/0401* (2013.01); *H01L 2224/04105* (2013.01); *H01L 2224/05008* (2013.01);
(Continued)

(58) Field of Classification Search
CPC ............ H01L 21/31051; H01L 21/565; H01L 23/293; H01L 23/3114; H01L 23/3135
USPC ........................... 257/738, E21.599; 438/110
See application file for complete search history.

(56) References Cited

U.S. PATENT DOCUMENTS

| 8,021,930 B2 | 9/2011 | Pagaila |
| 8,633,582 B2 | 1/2014 | Chang et al. |

(Continued)

FOREIGN PATENT DOCUMENTS

| CN | 101996894 A | 3/2011 |
| CN | 101996958 A | 3/2011 |

*Primary Examiner* — Matthew Gordon
(74) *Attorney, Agent, or Firm* — Slater Matsil, LLP

(57) ABSTRACT

Methods of packaging semiconductor devices and structures thereof are disclosed. In one embodiment, a method of packaging a semiconductor device includes providing a carrier wafer, providing a plurality of dies, and forming a die cave material over the carrier wafer. A plurality of die caves is formed in the die cave material. At least one of the plurality of dies is placed within each of the plurality of die caves in the die cave material. A plurality of packages is formed, each of the plurality of packages being formed over a respective at least one of the plurality of dies.

19 Claims, 7 Drawing Sheets

(51) Int. Cl.
*H01L 23/00* (2006.01)
*H01L 21/3105* (2006.01)
*H01L 21/56* (2006.01)
*H01L 23/29* (2006.01)
*H01L 25/065* (2006.01)
*H01L 25/00* (2006.01)
*H01L 23/498* (2006.01)

(52) U.S. Cl.
CPC ............... *H01L2224/05569* (2013.01); *H01L 2224/05571* (2013.01); *H01L 2224/11002* (2013.01); *H01L 2224/12105* (2013.01); *H01L 2224/131* (2013.01); *H01L 2224/13024* (2013.01); *H01L 2224/96* (2013.01); *H01L 2924/00014* (2013.01); *H01L 2924/07025* (2013.01); *H01L 2924/12042* (2013.01); *H01L 2924/181* (2013.01); *H01L 2924/18162* (2013.01)

(56) References Cited

U.S. PATENT DOCUMENTS

| | | |
|---|---|---|
| 2002/0192867 A1 | 12/2002 | Nishiyama |
| 2003/0227095 A1* | 12/2003 | Fujisawa ............. H01L 23/3128 257/782 |
| 2007/0059866 A1 | 3/2007 | Yang et al. |
| 2008/0020511 A1 | 1/2008 | Yang et al. |
| 2008/0105967 A1 | 5/2008 | Yang et al. |
| 2008/0197473 A1 | 8/2008 | Chen et al. |
| 2009/0302465 A1 | 12/2009 | Huang |
| 2010/0323469 A1 | 12/2010 | Borthakur et al. |
| 2011/0207264 A1 | 8/2011 | Tomisaka et al. |
| 2011/0215461 A1* | 9/2011 | Iijima .................... H01L 21/77 257/693 |
| 2012/0056334 A1 | 3/2012 | Yang et al. |

\* cited by examiner

US 9,406,581 B2

METHODS OF PACKAGING SEMICONDUCTOR DEVICES AND STRUCTURES THEREOF

This application is a division of and claims the benefit of U.S. patent application Ser. No. 13/270,850, filed Oct. 11, 2011 and entitled "Methods of Packaging Semiconductor Devices and Structures Thereof," which application is hereby incorporated herein by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLPs), in which integrated circuit die are packaged in packages that typically include a redistribution layer (RDL) that is used to fan out wiring for contact pads of the integrated circuit die so that electrical contact can be made on a larger pitch than contact pads of the die. Throughout this description, the term die is used to refer to both the singular and the plural.

When die are positioned on carrier wafers of WLPs and a molding compound is formed over the die, movement of the die can occur, which is undesirable. Die movement that is often evident as die rotation or die shifting may cause problems aligning subsequently formed material layers of the WLPs, such as the RDL, particularly in multi-chip packages in which two or more die are packaged together in a single package. Such die movement in package formation results in reduced yields.

Thus, what are needed in the art are improved packaging designs for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packaging designs and systems for semiconductor devices. Novel packaging methods and structures will be described herein.

Figure 1:
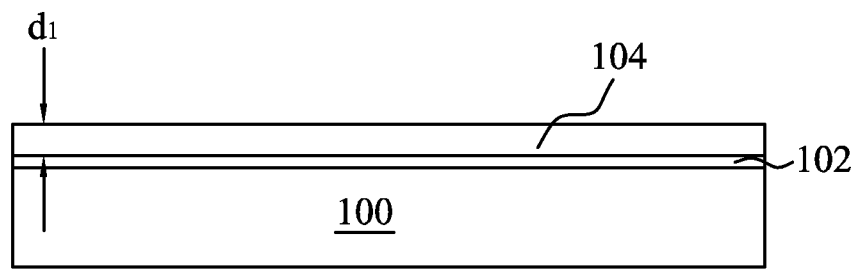
FIGS. 1 and 2 show cross-sectional views of a method of packaging a semiconductor device in accordance with an embodiment of the present disclosure, wherein a die cave material is formed over a carrier wafer and the die cave material is patterned with a plurality of die caves.

Referring first to FIG. 1, a cross-sectional view of a method of packaging a semiconductor device in accordance with an embodiment of the present disclosure is shown. A carrier wafer 100 is provided. The carrier wafer 100 may comprise glass, silicon, silicon oxide, aluminum oxide, and the like, as examples. The carrier wafer 100 thickness may be between about a few mils to several tens of mils and may comprise a diameter of about 300 mm in some embodiments. Alternatively, the carrier wafer 100 may comprise other materials and dimensions.

A layer of adhesive 102 is applied over the carrier wafer 100. The adhesive 102 may comprise glue and may comprise a liquid when applied, for example. The adhesive 102 comprises a material that is adapted to adhere a plurality of die 108 (not shown in FIG. 1; see FIG. 5) to the carrier wafer 102 in accordance with embodiments of the present disclosure.

A die cave material 104 is formed over the layer of adhesive 102, as shown in FIG. 1. The die cave material 104 is also referred to herein as a photosensitive material or a material in some embodiments. The die cave material 104 may comprise a photosensitive material such as a photoresist, in some embodiments. The die cave material 104 may comprise a polymer-based material, for example, in other embodiments. The die cave material 104 may comprise a layer of non-photosensitive material, such as polyimide or other materials that is patterned using a photosensitive material in some embodiments, and then the photosensitive material is removed, for example. The die cave material 104 may comprise WLCSP-HD8820, WLCSP-HD8930, or JSR-WPR-5100 having a thickness of dimension $d_1$ of about several μm to hundred μm, as examples, although alternatively, the die cave material 104 may comprise other materials and dimensions. The die cave material 104 comprises a material that is acceptable (i.e., regarding properties such as temperature, contamination of other material layers, shrinkage, and elongation) for use in semiconductor manufacturing and packaging processes, for example.

Figure 2:
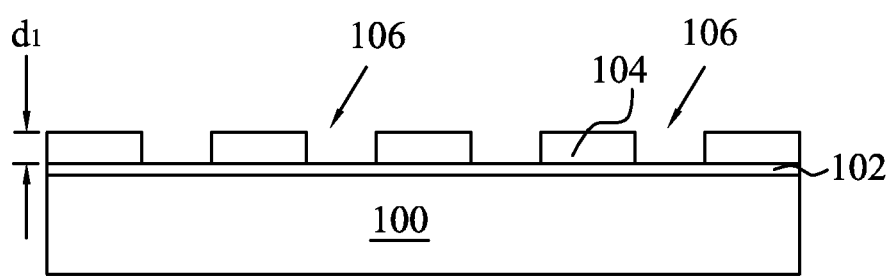

The die cave material 104 is patterned using lithography with a plurality of die caves 106, as shown in a cross-sectional view in FIG. 2. The die cave material 104 may advantageously be patterned directly because it comprises a photosensitive material in some embodiments. The die cave material 104 may be patterned by exposing the die cave material 104 to energy or light through a lithography mask (not shown), and the die cave material 104 may be developed. Alternatively, the die cave material 104 may be directly patterned. Exposed (or unexposed) portions of the die cave material 104 are then removed, e.g., using an ash process, etch process, or a combination thereof, leaving behind the patterns comprising the die caves 106. The die caves 106 comprise apertures in the die cave material 104 that leave the layer of adhesive 102 exposed. Each die cave 106 or pattern may comprise substantially a same size as a size of dies 108 to be placed on the carrier wafer 100 in a top view, for example, as can be seen in FIGS. 3A and 3B.

Figure 3A:
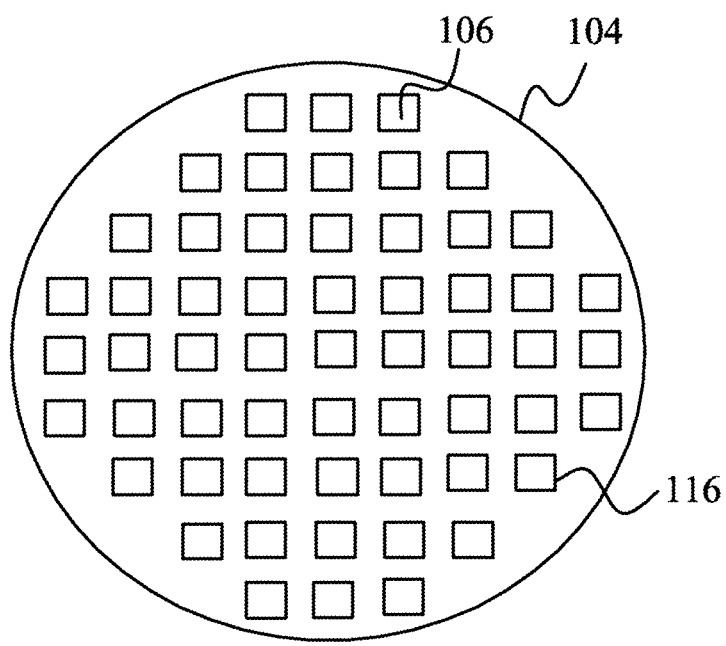
FIG. 3A illustrates a top view of the plurality of die caves shown in FIG. 2 for an embodiment wherein dies will be packaged individually in WLPs in accordance with an embodiment.
Figure 3B:
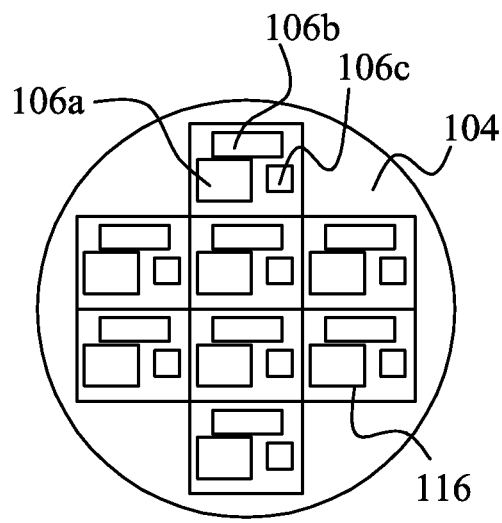
FIG. 3B illustrates a top view of the plurality of die caves shown in FIG. 2 for an embodiment wherein multiple dies will be packaged in single WLPs in accordance with another embodiment.

FIG. 3A illustrates a top view of the plurality of die caves 106 shown in FIG. 2 for an embodiment wherein single dies 108 will be packaged individually in packages in accordance with an embodiment. FIG. 3B illustrates a top view of a plurality of die caves 106a, 106b, and 106c shown in FIG. 2 wherein multiple dies 108 will be packaged in a plurality of single packages in accordance with another embodiment.

Figure 4:
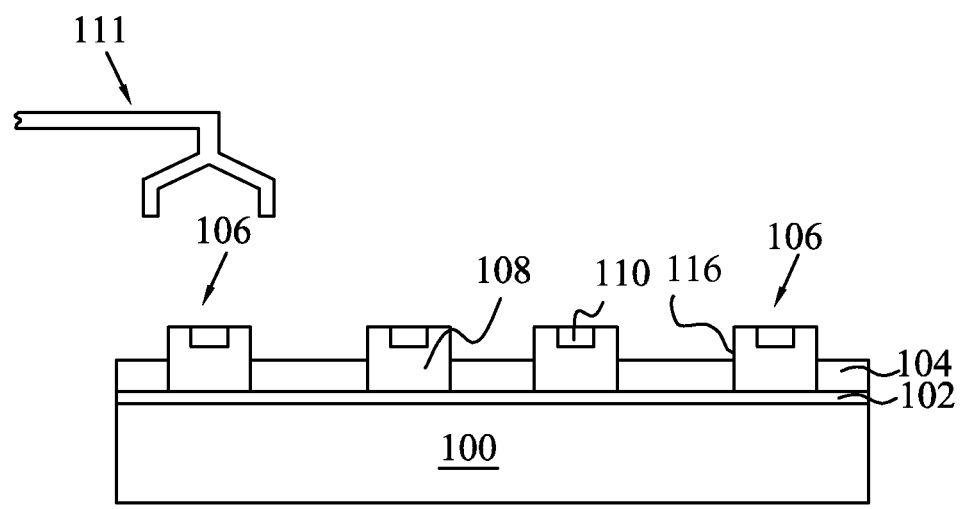
FIGS. 4 through 8 show cross-sectional views of a method of packaging a semiconductor device in accordance with an embodiment, wherein dies are placed face-up on the carrier wafer.

FIGS. 4 through 8 show cross-sectional views of a method of packaging the semiconductor devices 108 (also referred to herein as dies 108 or integrated circuits 108) in accordance with an embodiment after the manufacturing or packaging step shown in FIG. 2. A plurality of dies 108 is placed face-up (e.g., with contact pads 110 exposed) on the carrier wafer 100 in this embodiment, as shown in FIG. 4. Each die 108 comprises an integrated circuit having electronic circuitry formed thereon, for example. There may be dozens, hundreds, or thousands of electrical devices formed on each die 108, for example, depending on the application and the size of the dies 108. The dies 108 may comprise one or more layers of electrical circuitry and/or electronic functions formed thereon, and may include conductive lines, vias, capacitors, diodes, transistors, resistors, inductors, memory devices, logic devices, and/or other electrical components, for example (not shown). The dies 108 comprise semiconductor devices or chips that have been previously manufactured on a semiconductor wafer and have been singulated from the semiconductor wafer, e.g., detached from adjacent dies 108. An automated pick-and-place machine, a portion of which is shown at 111, may be used to attach the dies 108 to the carrier wafer 100, e.g., to the layer of adhesive 102 that is exposed through the patterned die cave material 104.

The dies 108 may include a plurality of contact pads 110 formed at a surface thereof, e.g., on a top surface thereof in the embodiment shown in FIG. 4. The dies 108 are placed face up on the layer of adhesive 102 on the carrier wafer 100 within the die caves 106 or patterns in the embodiment shown. Each die 108 is placed within a die cave 106 formed in the die cave material 104, as shown.

The plurality of dies 108 may comprise the shape of a square or rectangle in a top view, as shown in FIGS. 3A and 3B, which show the die cave 106, 106a, 106b, and 106c patterns. The dies 108 may comprise a plurality of sides 116 in a top view. The dies 108 may comprise four sides, for example, as shown. After the dies 108 are pick-and-placed into the die caves 106, the die cave material 104 may substantially abut (e.g., be adjacent to) the dies 108 or the integrated circuits on the plurality of sides 116 of the dies 108 in some embodiments.

Figure 5:
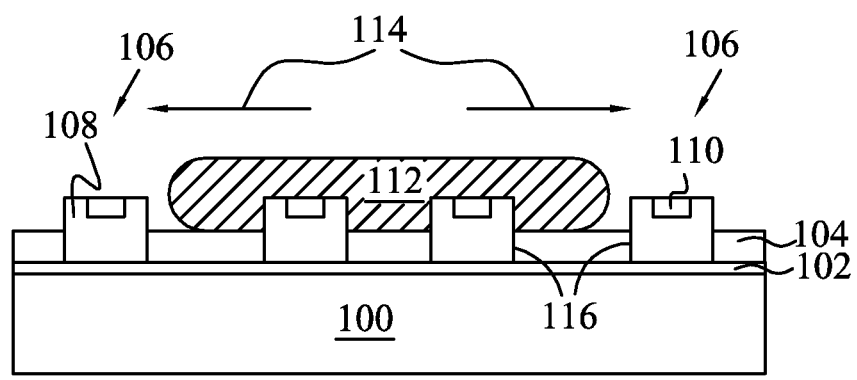
Figure 6:
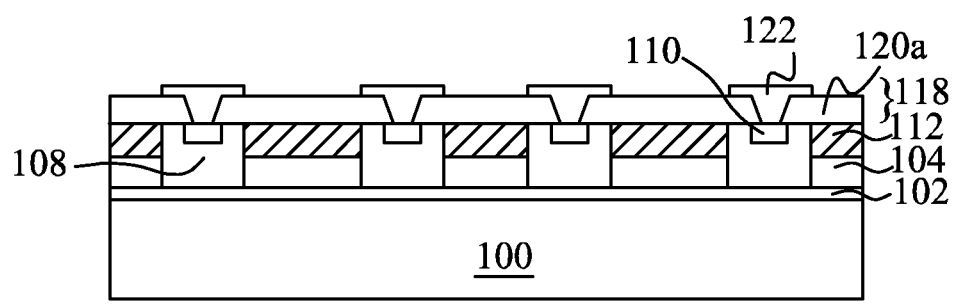

Next, a molding compound 112 is formed over the dies 108 and the die cave material 104, as shown in FIG. 5. The molding compound 112 comprises an encapsulating material and may comprise epoxy resin, silica filler, and/or positive resist materials, as examples, although other materials may also be used for the molding compound 112. The molding compound 112 may be deposited or molded onto the dies 108 and die cave material 104. The top surface of the molding compound 112 may be higher than (as shown in FIG. 5), substantially level with (as shown in FIG. 6), or slightly lower than, top surfaces of the dies 108. The molding compound 112 fills into the gaps between the pluralities of dies 108, as shown.

Placing the plurality of dies 108 on the carrier wafer 100 within the patterns 106 in the die cave material 104 is advantageous, because movement of the plurality of dies 108 on the carrier wafer 100 is prevented or reduced during the deposition of the molding compound 112 over the plurality of dies 108. For example, die 108 shift, die 108 rotation, and/or die 108 swim is prevented by the use of the novel die cave material 104 comprising the photosensitive material or other materials, in accordance with embodiments described herein. The molding compound 112 may exert a force 114 outwardly towards edges of the carrier wafer 100 on the dies 108 during the formation of the molding compound 112, for example. Die 108 movement can be more noticeable at edges of a carrier wafer 100 in some packaging processes, yet the novel die cave material 104 comprising the photosensitive material or other material reduces or eliminates such die 108 movement by retaining the dies 108 in the desired position and locations on the carrier wafer 100 within the die caves 106.

Next, an optional grinding process may be performed to planarize the top surfaces of the plurality of dies 108, so that any unevenness in the top surfaces of the dies 108 may be at least reduced, and possibly substantially eliminated. If the molding compound 112 comprises portions on the top surfaces of the dies 108, these portions of molding compound 112 are also removed by the grinding process, as shown in FIG. 6. Accordingly, the top surfaces of the remaining portions of the molding compound 112 may be level with top surfaces of the plurality of die 108. Furthermore, the height or thickness of the plurality of dies 108 may also be reduced to a desirable height during the grinding process.

Figure 7:
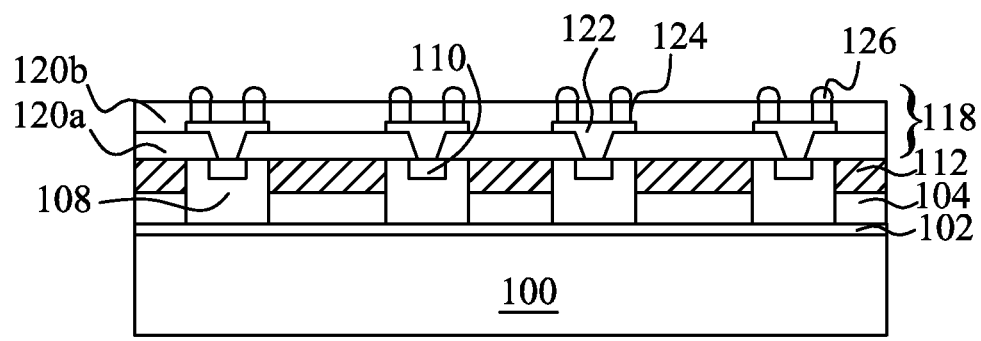

A wiring layer comprising an RDL 118 is formed over the top surfaces of the plurality of dies 108, also shown in FIG. 6. The RDL 118 may comprise an insulating material 120a with a plurality of conductive features 122 formed therein and on a top surface thereof. The conductive features 122 may provide fan-out of contact pads 110 of the dies 108 to other portions of the packaged semiconductor device 130 (see FIGS. 8 and 9, for example). Another insulating material 120b may be formed over insulating material 120a and conductive features 122, as shown in FIG. 7. Insulating materials 120a and 120b of the RDL 118 may comprise polymers or other insulating materials. Portions of the conductive features 122 of the RDL 118 are coupled to and make electrical contact with contact pads 110 on the dies 108. Portions of the conductive features 122 may comprise electrical fan-out structures, for example. An optional under bump metallization (UBM) structure 124 may be formed on portions of the RDL 118 and insulating layer 120b, as shown in FIG. 7. A plurality of solder balls 126 is formed over portions of the RDL 118, as shown in FIG. 7. The UBM structure 124 facilitates in the connections and formation of the solder balls 126, for example.

The structure shown in FIG. 7 effectively comprises a reconstructed wafer over the carrier wafer 100 that includes the plurality of dies 108, for example. The molding compound 112, RDL 118, solder balls 126, and also the die cave material 104 comprise the packages for the plurality of dies 108 which comprises a FO-WLP in the embodiment shown.

Figure 8:
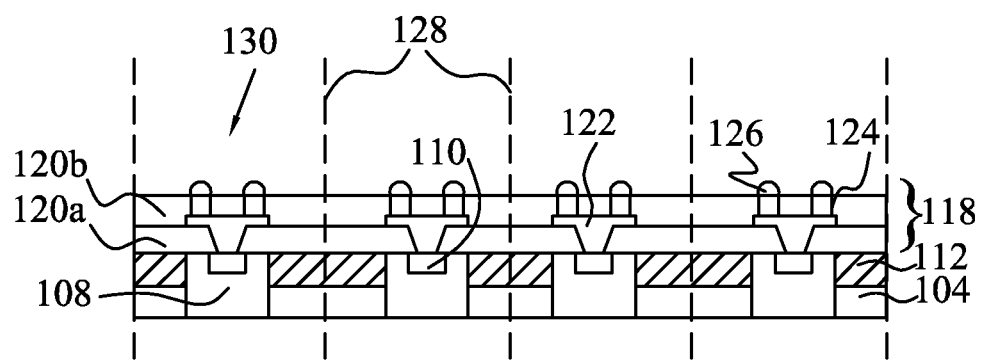
Figure 9:
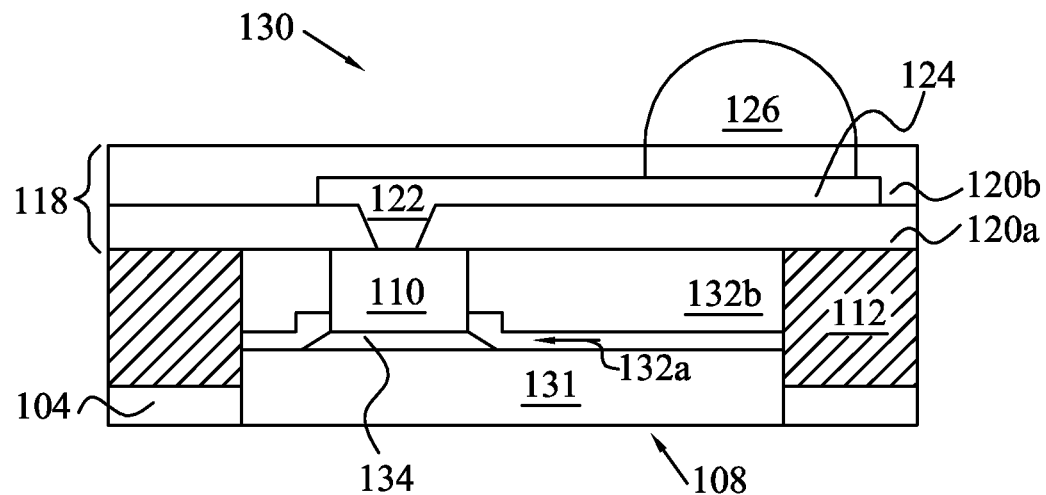
FIG. 9 shows a more detailed cross-sectional view of a packaged semiconductor device after singulating the packaged die.

Next, at least the carrier wafer 100 is removed from the packaged plurality of dies 108, as shown in FIG. 8. The molding compound 112 and RDL 118 support the dies 108 during the debonding process of the carrier wafer 100 from the packaged dies 108, for example. The layer of adhesive 102 may also be removed when the carrier wafer 100 is removed or in a separate processing step, e.g., using light (i.e., laser) or a thermal process. The packaged plurality of dies 108 is then singulated or separated at singulation lines 128, forming individual packaged dies 108, also referred to herein as packaged semiconductor devices 130, as shown in FIG. 9 in a more detailed view. To singulate the packaged dies 108 from adjacent packaged die 108, tape (not shown) may be applied to the dies 108. The tape may comprise dicing tape that supports the packaged dies 108 during the singulation process. The packaged plurality of dies 108 is then removed from the tape, leaving the packaged semiconductor devices 130.

FIG. 9 shows a more detailed cross-sectional view of a packaged semiconductor device 130 after singulating the packaged dies 108. FIG. 9 also shows a more detailed cross-sectional view of a die 108 and the RDL 118. The more detailed view of the die 108 and RDL 118 are exemplary; alternatively, the die 108 and RDL 118 may comprise other configurations, layouts and/or designs. In the embodiment shown, the die 108 includes a substrate 131 comprising silicon or other semiconductive materials. Insulating layers 132a and 132b may comprise passivation layers disposed on the substrate 131. Contact pads 110 of the die 108 may be formed over conductive features 134 disposed over the substrate 131 or disposed in an upper material layer of the substrate 131. The conductive features 134 may comprise metal and/or semiconductive pads, plugs, vias, or conductive lines that make electrical contact with active features of the substrate 131, not shown. The contact pads 110 may be formed in insulating layers 132a and/or 132b that may comprise a polymer layer or other insulating materials.

In the embodiment shown in FIGS. 1, 2, and 4 through 9, the dies 108 are placed face-up on the carrier wafer 100, with the contact pads 110 of the dies 108 facing away from the carrier wafer 100. Note that only one contact pad 110 is shown for each die 108 in the drawings; however, a plurality of contact pads 110, i.e., dozens or hundreds of contact pads 110 may be formed across a surface of each die 108, for example, not shown. A surface of the dies 108 proximate the contact pads 110 is proximate the molding compound 112 in the embodiment of FIGS. 5 through 9.

Figure 10:
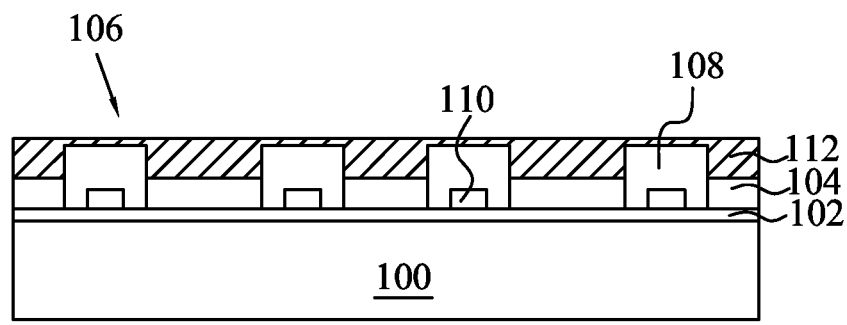
FIGS. 10 and 11 show cross-sectional views of a method of packaging a semiconductor device in accordance with another embodiment, wherein the dies are placed face-down on the carrier wafer.
Figure 11:
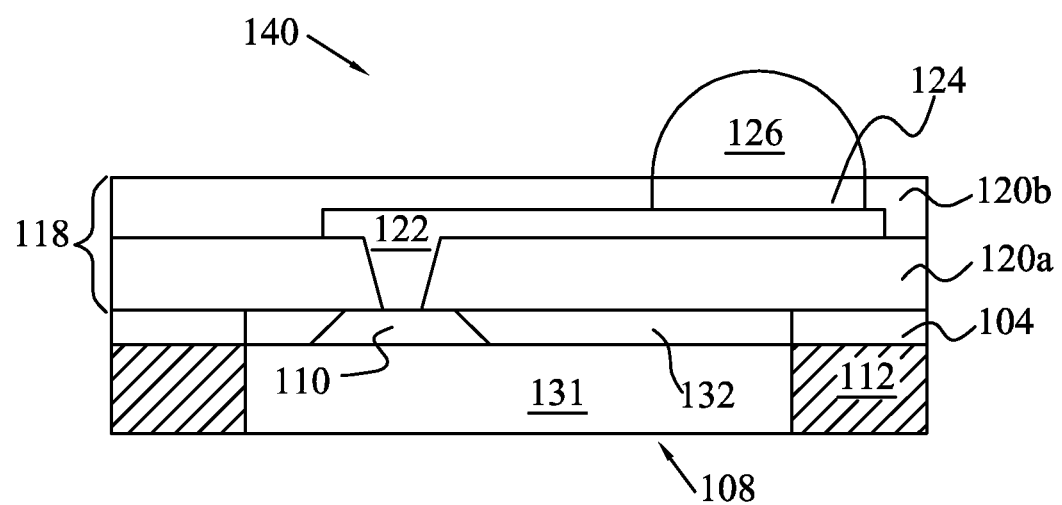

FIGS. 10 and 11 show cross-sectional views of a method of packaging semiconductor devices or dies 108 in accordance with another embodiment, wherein the dies 108 are placed face-down on the carrier wafer 100. Like numerals are used for the various elements in FIGS. 10 and 11 that were used to describe FIGS. 1 through 9, and to avoid repetition, each reference number shown in FIGS. 10 and 11 is not described again in detail herein.

In this embodiment, a packaged semiconductor device 140 includes a die 108 that is placed face-down on the carrier wafer 100, with the contact pads 110 of the die 108 facing towards the carrier wafer 100, as shown in FIG. 10. A surface of the die 108 proximate the contact pads 110 is proximate the die cave material 104 (e.g., the photosensitive material 104) in the embodiment of FIGS. 10 and 11. An RDL 118 may be formed that has conductive features 122 that make electrical contact with the contact pads 110 of the die 108 in this embodiment, as shown in FIG. 11.

Advantages of embodiments of the disclosure include providing novel packaging methods and structures that prevent or reduce die 108 shift, die 108 rotation, die 108 swim, and/or other undesired die 108 movement during the formation of a molding compound 112 and other subsequent processing of the packages. The novel packaging methods described herein are easily implementable in manufacturing and packaging process flows for semiconductor devices 108. The packaging methods and structures achieve higher yields and improved reliability by the use of the novel die cave material 104 described herein that holds the dies 108 in place in a lateral or horizontal direction concurrently with the layer of adhesive 102, which holds the dies 108 in place in a vertical direction. Improved results from molding processes are achievable, i.e., of forming the molding compound 112 of the packages. Connections to subsequently formed layers of the packages are made more reliable, such as to the RDL 118. Embodiments of the disclosure are particularly beneficial for use in multi-chip packages that have more than one die 108, as shown in the top view of FIG. 3B, for example, in which die shift can be a concern.

Embodiments of the present disclosure include the methods of packaging semiconductor devices or dies 108 described herein, and also include packaged semiconductor devices 130 and 140 that have been packaged using the methods and materials described herein.

Although embodiments of the present disclosure have been described with reference to FO-WLPs, a variety of different package types would benefit from using a die cave material 104 described herein to assist in the placement of dies 108 and ensure that the dies 108 remain in place during subsequent processing. The novel packaging techniques and die cave material 104 may be implementable in other WLP designs, three dimensional integrated circuit (3DIC) package designs, through-silicon via (TSV) package designs, bump-on-trace (BOT) packages, or a chip-on-wafer assembly packages, as examples.

In accordance with one embodiment of the present disclosure, a method of packaging a semiconductor device includes providing a carrier wafer, providing a plurality of dies, and forming a die cave material over the carrier wafer. A plurality of die caves is formed in the die cave material. At least one of the plurality of dies is placed within each of the plurality of die caves in the die cave material. A plurality of packages is formed, each of the plurality of packages being formed over a respective at least one of the plurality of dies.

In accordance with another embodiment, a method of packaging a semiconductor device includes providing a carrier wafer and forming a layer of adhesive over the carrier wafer. A material is formed over the layer of adhesive, and the material is patterned with patterns for a plurality of dies to be placed on the carrier wafer. The method includes placing the plurality of dies on the layer of adhesive over the carrier wafer within the respective patterns in the material, forming packages over the plurality of dies, and singulating the packages.

In accordance with yet another embodiment, a packaged semiconductor device includes at least one integrated circuit and a photosensitive material disposed around the at least one integrated circuit. The photosensitive material substantially abuts the at least one integrated circuit on a plurality of sides of the at least one integrated circuit. A package is disposed over the at least one integrated circuit and the photosensitive material.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaged semiconductor device, comprising:
    at least two integrated circuits, each of the at least two integrated circuits having a plurality of sides, wherein a first bottom surface of a first one of the at least two integrated circuits and a second bottom surface of a second one of the at least two integrated circuits are planar with each other;
    a photosensitive material disposed around the at least two integrated circuits, the photosensitive material abutting the at least two integrated circuits on the plurality of sides of the at least two integrated circuits;
    a molding compound disposed adjacent to the at least two integrated circuits, wherein a top surface of the molding compound is planar with a top surface of the at least two integrated circuits; and
    a package disposed over the at least two integrated circuits and the photosensitive material, wherein the package comprises a redistribution layer (RDL) disposed over the at least two integrated circuits and the molding compound.

2. The packaged semiconductor device according to claim 1, wherein the at least two integrated circuits comprise a plurality of contact pads disposed proximate the top surface of the at least two integrated circuits, wherein the top surface of the at least two integrated circuits is proximate the molding compound.

3. The packaged semiconductor device according to claim 1, wherein the at least two integrated circuits comprise a plurality of contact pads disposed proximate the first bottom surface and the second bottom surface, wherein the first bottom surface is proximate the photosensitive material.

4. The packaged semiconductor device according to claim 1, further comprising a plurality of solder balls disposed over the RDL.

5. The packaged semiconductor device according to claim 1, wherein the at least two integrated circuits comprises at least three integrated circuits.

6. A semiconductor device comprising:
    more than one of a plurality of dies, wherein each plurality of dies is within a respective die cave within a die cave material, wherein each die of the more than one of the plurality of dies has a bottom surface planar with each other;
    an encapsulating material over the die cave material, the encapsulating material adjoining a sidewall of at least one die of each plurality of dies, wherein a top surface of the encapsulating material is planar with a top surface of at least one die within each of the plurality of die caves; and
    a package located over the more than one of the plurality of dies.

7. The semiconductor device of claim 6, wherein the die cave material comprises a photosensitive material.

8. The semiconductor device of claim 6, wherein the die cave material comprises a polymer-based material.

9. The semiconductor device of claim 6, wherein the die cave material comprises polyimide.

10. The semiconductor device of claim 6, further comprising a redistribution layer formed adjacent the top surface.

11. The semiconductor device of claim 10, further comprising external connectors electrically connected to the redistribution layer.

12. The semiconductor device of claim 6, wherein at least one of the more than one of the plurality of dies further comprises contacts adjacent to the top surface.

13. The semiconductor device of claim 6, wherein at least one of the more than one of the plurality of dies further comprises contacts adjacent to the bottom surface.

14. The semiconductor device of claim 6, wherein the die cave material comprises WLCSP-HD8820, WLCSP-HD8930, or JSR-WPR-5100.

15. A semiconductor device comprising:
    a die cave material surrounding a die cave region, wherein the die cave region is free from the die cave material, the die cave material having a first top surface;
    a first semiconductor die located within the die cave region;
    a second semiconductor die located within the die cave region, wherein the second semiconductor die is laterally separated from the first semiconductor die within the die cave region and has a third top surface;
    an encapsulant encapsulating both the first semiconductor die and the second semiconductor die, wherein the encapsulant has a second top surface planar with the third top surface, and wherein the third top surface faces away from the die cave region; and
    a package located over the first semiconductor die.

16. The semiconductor device of claim 15, further comprising a redistribution layer over the encapsulant and electrically connected to the first semiconductor die.

17. The semiconductor device of claim 16, further comprising conductive balls electrically connected to the redistribution layer.

18. The semiconductor device of claim 15, wherein the die cave material is a photosensitive material.

19. The semiconductor device of claim 18, wherein the photosensitive material is polyimide.

* * * * *